United States Patent [19]

Piro

[11] Patent Number: 4,701,637

[45] Date of Patent: Oct. 20, 1987

[54] SUBSTRATE BIAS GENERATORS

[75] Inventor: Ronald A. Piro, South Burlington, Vt.

[73] Assignee: International Business Machines Corporation, Armonk, N.Y.

[21] Appl. No.: 713,668

[22] Filed: Mar. 19, 1985

[51] Int. Cl.[4] ........................ H03K 3/353; H03L 1/00

[52] U.S. Cl. ................................ 307/297; 307/296 R; 307/304; 307/200 B

[58] Field of Search .................... 307/297, 296 Z, 304, 307/443, 200 B

[56] References Cited

U.S. PATENT DOCUMENTS

| | | | |
|---|---|---|---|
| 4,229,667 | 10/1980 | Heimbigner et al. | 307/297 |
| 4,322,675 | 3/1982 | Lee et al. | 323/277 |
| 4,336,466 | 6/1982 | Sud et al. | 307/297 |
| 4,378,506 | 3/1983 | Taira | 307/297 |
| 4,403,158 | 9/1983 | Slemmer | 307/297 |
| 4,409,496 | 10/1983 | Baba | 307/296 R |
| 4,450,515 | 5/1984 | Takemae et al. | 363/60 |
| 4,471,290 | 9/1984 | Yamaguchi | 323/274 |
| 4,571,505 | 2/1986 | Eaton, Jr. | 307/297 |

*Primary Examiner*—Stanley D. Miller
*Assistant Examiner*—Richard Roseen
*Attorney, Agent, or Firm*—Stephen J. Limanek

[57] ABSTRACT

A substrate bias generator or circuit is provided which includes a charge pump having a series circuit with first and second nodes connected between a semiconductor substrate and a point of reference potential. A first voltage having a first phase is coupled to the first node and a second voltage having a second phase is coupled to the second node. A field effect transistor is connected between the substrate and the second node and the control electrode of the transistor is connected to the first node. The series circuit includes first and second devices, preferably diodes, with the first device being connected between the first node and the point of reference potential and the second device being connected between the first and second nodes.

23 Claims, 9 Drawing Figures

SUBSTRATE BIAS GENERATORS

DESCRIPTION

1. Technical Field

This invention relates to semiconductor substrate bias generators and, more particularly, to charge pumping circuits used in substrate bias generators.

2. Background Art

Substrate bias generators have been used extensively to enhance the performance of circuits employing N channel devices in integrated circuits formed in semiconductor substrates or chips. The substrate bias lowers junction capacitance between the source/drain diffusions and the substrate, reduces threshold variations due to source-to-substrate bias and may permit higher channel mobility due to a reduction in the threshold tailoring implant. More recently substrate bias generators have been used in complementary metal oxide semiconductor (CMOS) technology to minimize the latch-up problem.

The desired bias voltage on a substrate can be provided simply by connecting the substrate to an external bias source or, alternatively, by incorporating into the semiconductor chip a circuit capable of generating a bias voltage having a magnitude within a preselected range of voltages derived from the circuit's voltage supply source. This latter approach to biasing the semiconductor substrate or chip is preferable to the use of separate external bias sources because it eliminates not only the need for additional outside or external power supplies but also an additional pad on the substrate or chip.

Many circuits for producing a substrate bias voltage have been proposed, such as, e.g., the circuit disclosed in U.S. Pat. No. 4,229,667, filed on Aug. 23, 1978, by G. L. Heimbignor et.al., which includes a two phase system wherein charge is drawn from the substrate through a diode. A single phase generator which also utilizes a diode for transferring charge from the substrate is taught in U.S. Pat. No. 4,378,506, filed on Aug. 22, 1980, by S. Taira. This latter patent suggests that the devices of the generator may be either N channel devices or P channel devices.

U.S. Pat. No. 4,450,515, filed on June 14, 1982, also discloses a single phase generator having a diode through which charge is drawn from the substrate but additionally includes a field effect transistor interposed between the substrate and the diode which is controlled by an external or off-chip voltage source.

U.S. Pat. No. 4,403,158, filed on May 15, 1981, by W. C. Slemmer, discloses a substrate bias generator wherein charge from the substrate is drawn through a field effect transistor having somewhat complex control circuitry.

DISCLOSURE OF THE INVENTION

It is an object of this invention to provide a highly efficient substrate bias generator having a simple circuit with minimal injection of minority carriers into the substrate, particularly for use in the CMOS technology to minimize the latch-up problem encountered therein.

In accordance with the teachings of this invention, a substrate bias generator is provided which includes a charge pump having a series circuit with first and second nodes to which first and second out of phase voltages are applied, respectively, and wherein a field effect transistor is connected between the substrate and the first node and the control electrode of the transistor is connected to the second node. In a preferred embodiment, the series circuit further includes first and second diodes, with the first diode being connected between a point of reference potential and the second node and the second diode being connected between the first and second nodes.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
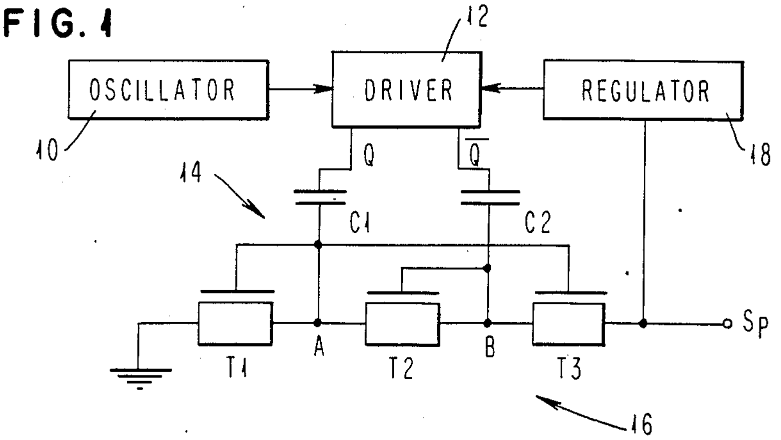
FIG. 1 illustrates one embodiment of the substrate bias generator of the present invention which utilizes all N channel devices for providing a negative bias on a P type conductivity semiconductor substrate.

Referring to the drawings in more detail, there is illustrated in FIG. 1 one embodiment of the substrate bias generator of the present invention which includes an oscillator 10 having its output connected to a driver circuit 12 producing two out-of-phase voltages at terminals Q and $\overline{Q}$ for driving a charge pump 14. The charge pump 14 includes a series circuit 16 having field effect transistors T1, T2 and T3, with transistor T2 being connected to transistor T1 at node A and to transistor T3 at node B. The series circuit 16 is connected between a semiconductor substrate having a P type conductivity at a terminal $S_p$ and a point of reference potential such as ground. Transistor T1 is arranged as a diode by connecting its control electrode to node A and transistor T2 is also arranged as a diode by connecting its control electrode to node B. Transistor T3 has its control electrode also connected to node A, with its drain connected to terminal $S_p$. Terminal Q of the driver circuit 12 is connected to node A through a first capacitor C1 and terminal $\overline{Q}$ of the driver circuit 12 is connected to node B through a second capacitor C2. The driver circuit 12 is controlled by a regulator 18 which is connected to the substrate terminal $S_p$. It should be understood that the oscillator 10, the driver circuit 12 and the regulator 18 may be of any known type, with the driver preferably producing voltages from terminals Q and $\overline{Q}$ that are substantially 180° out of phase with each other. The voltage VH of the supply source for these circuits is typically +5 volts.

Figure 2:
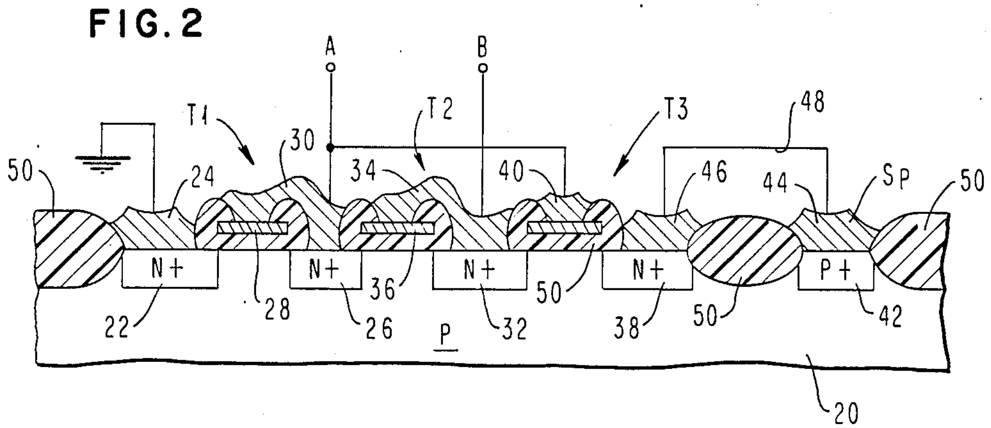
FIG. 2 is a sectional view of a semiconductor substrate illustrating the formation therein of the generator shown in FIG. 1.

In FIG. 2 of the drawings there is shown a sectional view of the transistors T1, T2 and T3 of the substrate bias generator of FIG. 1 formed in a semiconductor substrate 20 having a P type conductivity and preferably made of silicon. As indicated in FIG. 2, transistor T1 is an N channel transistor having an N+ source diffusion region 22 connected through a metallic film 24 to a point of reference potential such as ground and an N+ drain diffusion region 26 connected to its gate electrode 28 through a metallic film 30 which is at node A. Transistor T2 is also an N channel transistor which uses the N+ diffusion region 26 as its source and N+ diffusion region 32 as its drain, with a metallic film 34, which is at node B, connecting the drain region 32 to its control electrode 36. Transistor T3 likewise is an N channel transistor which uses the N+ diffusion region 32 as its source and N+ diffusion region 38 as its drain with a metallic film 40 connecting its control electrode to node A. A P+ diffusion region 42 having a metallic film 44, as substrate terminal $S_p$ contacted thereto and the N+ drain diffusion region 38 having a metallic film 46 contacted thereto are interconnected by any appropriate conductor 48. Insulating regions 50, preferably made of silicon dioxide, are provided to appropriately isolate the various elements of the circuit as is well known.

Figure 3:
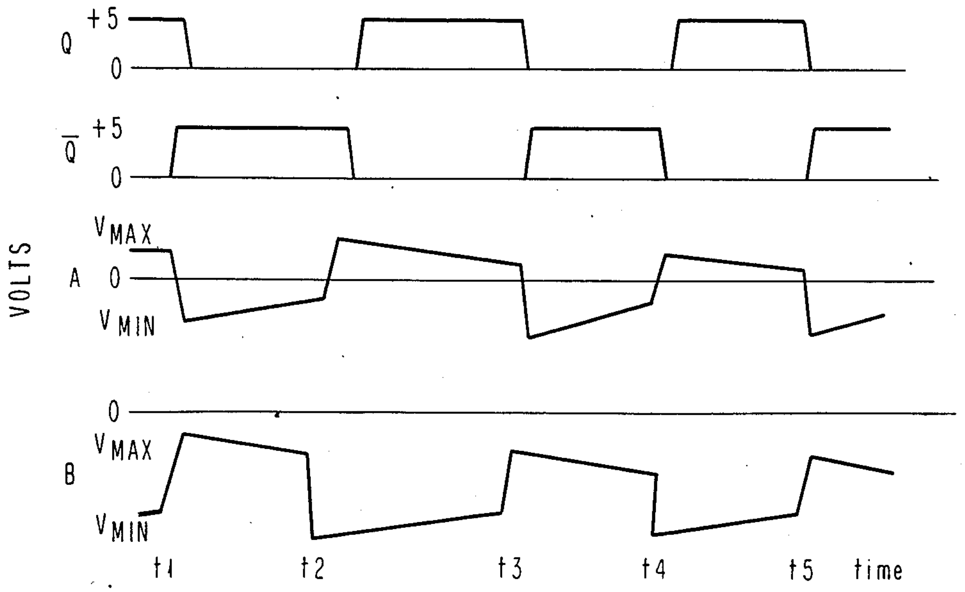
FIG. 3 is a pulse program which may be used to operate the generator illustrated in FIGS. 1 and 2.

The generator circuit of FIGS. 1 and 2 operates to provide a negative bias voltage to the P type substrate 20 by using the pulse program indicated in FIG. 3 of the drawings. Basically, the out-of-phase voltages at terminals Q and $\overline{Q}$ alternately charge and discharge capacitors C1 and C2 and transistors T1, T2 and T3 are connected at nodes A and B so as to cause negative voltages to develop at nodes A and B with the resulting negative voltage at node B being completely transferred to the substrate 20 through transistor T3. Referring more specifically to the pulse program in FIG. 3, at time tl, the voltage on node A is driven negative as the voltage at terminal Q is reduced from +5 volts to 0 volts, while the voltage on node B begins to rise as the voltage at terminal $\overline{Q}$ goes to +5 volts. Since node B is more than a threshold voltage of transistor T2 higher than the voltage at node A, transistor T2 turns on, transferring negative charge from node A to node B. Transistor T3 remains off at time t1 since the voltage at node A is less than a threshold voltage above the voltage on substrate 20 and on node B. At time t2, i.e., at the beginning of the opposite phase of the cycle, the voltage at node A rises when the voltage at terminal Q goes to +5 volts, while the voltage on node B falls when the voltage at terminal $\overline{Q}$ goes to 0 volts. The voltage on node A rises to a threshold voltage above ground, where it is held by transistor T1. Meanwhile, since the voltage at node B is lower than the voltage at node A, transistor T2 turns off, however, with the voltage at node A being above ground, transistor T3 turns on fully to completely transfer charge from node B to the substrate 20 through substrate terminal $S_p$. It can be seen that a similar cycle is repeated at times t3 and t4, and then another cycle starts at time t5.

It should be noted that the voltage at node A swings between a maximum positive voltage $V_{MAX}$ of about one volt, i.e., the threshold voltage of transistor T1, except for overshooting effects, and a minimum voltage $V_{MIN}$ of about −4 volts, for a voltage supply source of +5 volts. The voltage at node B swings between a maximum of about −3 volts at time t1 to a minimum of about −8 volts at time t2. It should be noted that the maximum voltage of −3 volts at node B is equal to the minimum voltage at node A, i.e., −4 volts, plus the threshold voltage of transistor T2. Since the transistor T3 is turned on hard by connecting its control electrode to node A and since node B has a minimum or low voltage of −8 volts, it can be seen that the substrate 20 can be charged theoretically to a negative bias of approximately −8 volts. It should be understood that due to charge transfer losses, actual voltages may differ somewhat from the values set forth hereinabove, depending in part on the sizes of the capacitors C1 and C2. In addition, it should be noted that the substrate bias generator or circuit of the present invention is self-regulating due to the interaction of the voltage at node A and the voltage at substrate terminal $S_p$. If the substrate voltage at terminal $S_p$ becomes lower, i.e., more negative, than a threshold voltage below the minimum voltage $V_{MIN}$ at node A, transistor T3 will remain on when node B is high, thus charge from the substrate 20 will leak back into node B to raise or make more positive the voltage on the substrate 20. Accordingly, the output of the substrate bias generator of the present invention is limited to $V_{SX\ MIN}=V_{A\ MIN}-V_t$, where $V_{SX\ MIN}$ is the minimum or most negative voltage on the substrate 20, $V_{A\ MIN}$ is the most negative voltage at node A and $V_t$ is the threshold voltage of transistor T3. If a substrate bias voltage of a more positive magnitude is desired, a regulator 18 of any known type may be connected between the substrate terminal $S_p$ and the driver circuit 12.

It can also be seen that since the transistor T3 is turned on hard by the voltage on node A all the charge on node B is transferred to terminal $S_p$ which prevents minority carrier injection from occurring into the substrate 20 from a forward biased P−N junction at the N+ diffusion region 32 of FIG. 2 or node B.

Figure 4:
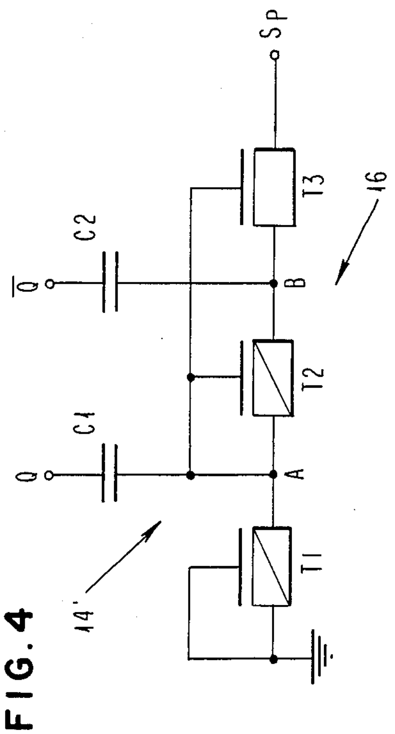
FIG. 4 illustrates a second embodiment of the substrate bias generator of the present invention which utilizes two P channel devices and one N channel device for providing a negative bias on a P type conductivity substrate.
Figure 5:
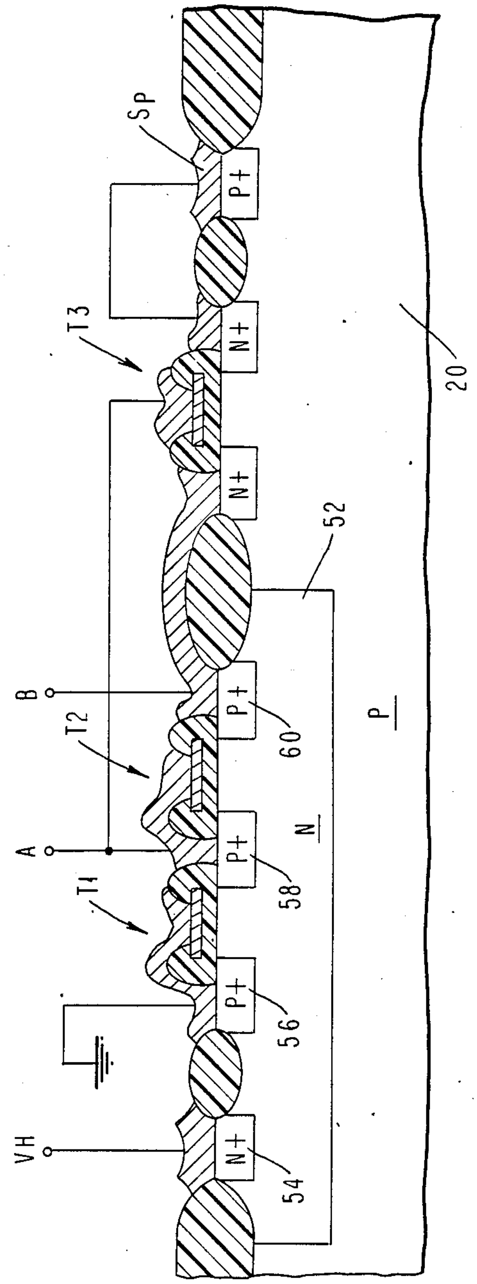
FIG. 5 is a sectional view of a semiconductor substrate illustrating the formation therein of the generator shown in FIG. 4.

While minority carrier injection has been eliminated at node B, injection may still occur on node A, i.e., diffusion region 26, though to a lesser extent. To eliminate the injection problem completely, the transistors T1 and T2 of the P channel type are used in the generator of FIG. 4 of the drawings. The generator or circuit of FIG. 4 is similar to that of FIG. 1 but differs therefrom primarily in that the charge pump 14' has the P channel transistors T1 and T2 formed in an N well 52, as shown in FIG. 5, which is biased to the supply voltage VH, e.g., to +5 volts. As in FIG. 1, node A will not rise to a voltage higher than the threshold voltage of transistor T1 due to its diode action and transistor T2 will turn on when node A goes more than a threshold voltage below the voltage at node B. Transistor T3 functions in the same manner as discussed hereinabove in connection with the circuit of FIG. 1.

Since the voltage VH applied to the N well 52 is significantly more positive than any of the voltages applied to the P+ diffusion regions 56, 58 and 60 of the transistors T1 and T2, there is little or no likelihood of the P−N junctions between P+ regions 56, 58 and 60 and N well 52 being forward biased to produce minority carrier injection.

Although the generators discussed hereinabove in connection with this invention have been described as providing a negative bias voltage to a P type conductivity semiconductor substrate, it should be understood that the generator or circuit of this invention may be modified to provide a positive bias voltage to an N type conductivity substrate.

Figure 6:
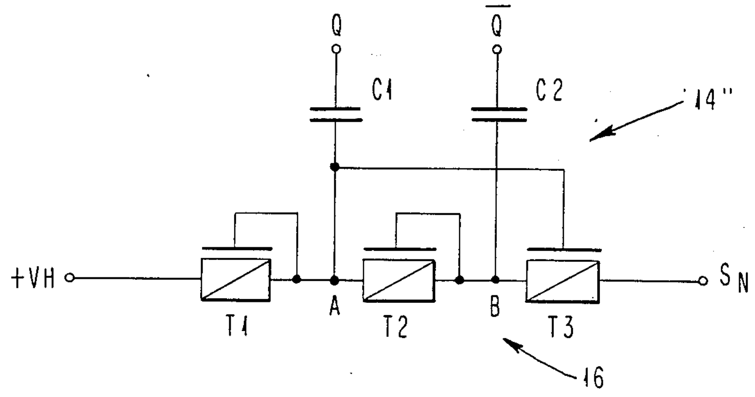
FIG. 6 illustrates a third embodiment of the substrate bias generator of the present invention which utilizes three P channel devices for providing a positive bias on an N type conductivity semiconductor substrate.
Figure 7:
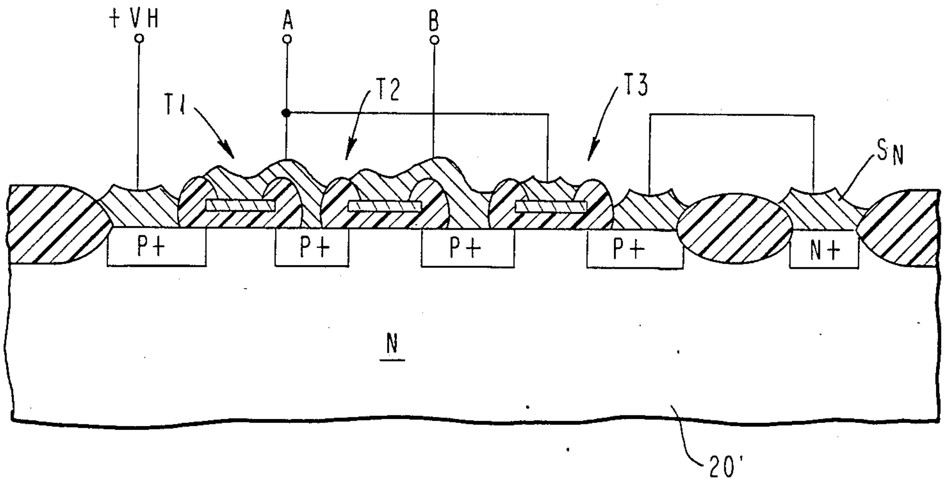
FIG. 7 is a sectional view of a semiconductor substrate illustrating the formation therein of the generator shown in FIG. 6.

Referring to FIGS. 6 and 7 of the drawings, the generator illustrated therein provides a positive bias voltage to the substrate terminal $S_N$ of an N type conductivity semiconductor substrate 20' having a magnitude greater than +VH. The charge pump 14" includes a series circuit 16 connected between the substrate terminal $S_N$ and the supply voltage +VH, with a sectional view of the transistors T1, T2 and T3 of the series circuit 16 being illustrated in FIG. 7 of the drawings, with transistors T1, T2 and T3 being of the P channel type.

In the operation of the circuit illustrated in FIGS. 6 and 7, a two phase pulse program similar to that in FIG. 3 still applies for the nodes Q and $\bar{Q}$. Due to the arrangement of transistor T1 as a diode, the minimum voltage on node A is limited to a magnitude equal to VH minus the threshold voltage of transistor T1 during a first phase of the cycle, or about +4 volts. During a second phase of the cycle, the voltage on node A obtains a positive value equal to the magnitude at the minimum voltage plus the magnitude of the voltage swing on node Q, or about +9 volts. The maximum magnitude of node A is transferred through transistor T2 to node B on this second phase, causing node B to obtain a minimum value equal to the maximum value on node A minus the threshold voltage of transistor T2, or about +8 volts. The maximum voltage on node B of about 13 volts is transferred to the terminal $S_N$ on the first phase of the cycle, due to transistor T3 being driven fully on by the minimum voltage of Node A applied to the control node of transistor T3. Due to self regulation of this circuit, the voltage obtained on the N type conductivity substrate 20' will be somewhat less than the theoretical value of 13 volts, i.e., the maximum value of node A plus the threshold voltage of transistor T3.

Figure 8:
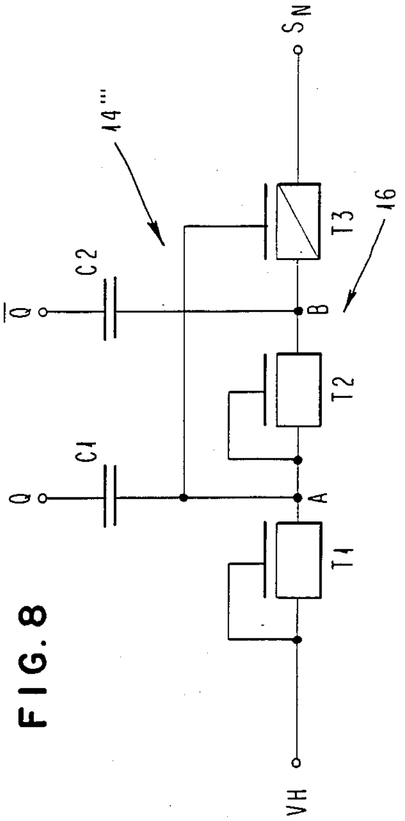
FIG. 8 illustrates a fourth embodiment of the substrate bias generator of the present invention which utilizes two N channel devices and a P channel device for providing a positive bias on an N type conductivity substrate.
Figure 9:
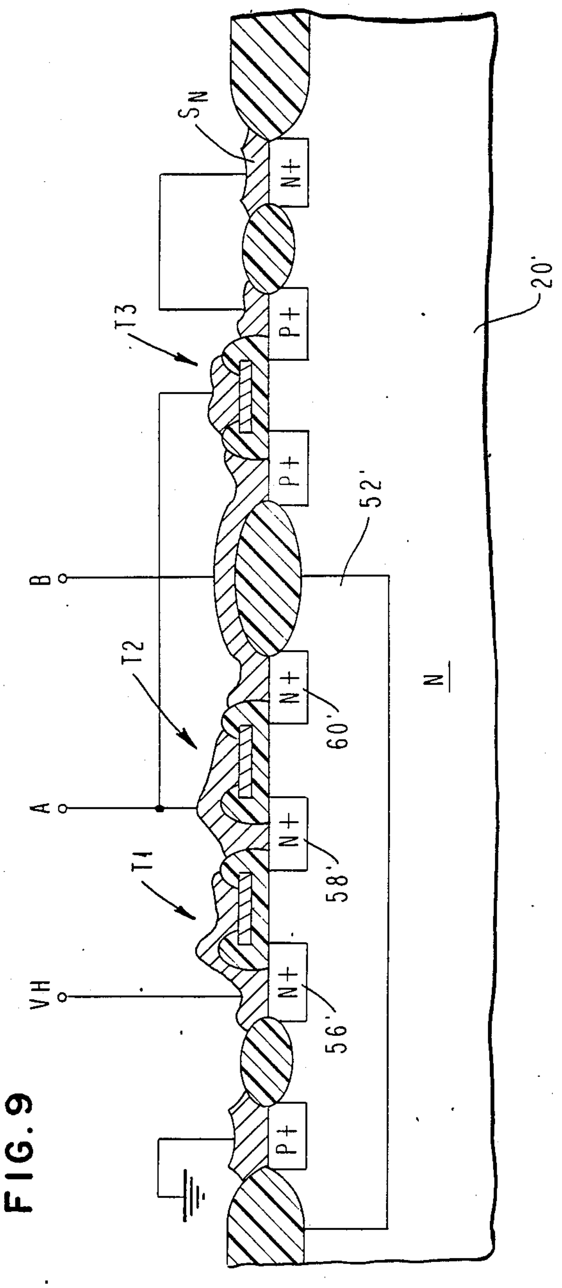
FIG. 9 is a sectional view of a semiconductor substrate illustrating the formation therein of the generator shown in FIG. 8.

In the embodiment of FIGS. 6 and 7, minority carrier injection may still occur on node A. To eliminate injection completely, a similar technique as was used in going from FIG. 1 to FIG. 4 is employed in the embodiment of FIGS. 8 and 9. In the embodiment of the substrate bias generator of the present invention illustrated in FIGS. 8 and 9, N channel devices T1 and T2 are formed in a P well 52' held at ground potential with a P channel transistor T3 formed in the N substrate 20', in order to provide a positive voltage on the N type conductivity substrate. Transistors T1, T2 and T3 function in the same manner as discussed hereinabove in connection with the circuit of FIG. 6.

Since the voltage applied to the P well 52' is significantly less positive than voltages applied to N+ diffusion regions 56', 58' and 60' of the transistors T1 and T2, there is little or no likelihood of the P−N junctions between N+ regions 56', 58' and 60' and P well 52' being forward biased to produce minority carrier injection.

It can be seen that in accordance with the teachings of this invention a self regulating, highly efficient substrate bias generator has been provided which utilizes a very simple circuit. The generator of this invention significantly reduces the minority carrier injection into the substrate which minimizes latch up concerns in CMOS circuits.

While the invention has been particularly shown and described with reference to preferred embodiments thereof, it will be understood by those skilled in the art that various changes in form and details may be made therein without departing from the spirit and scope of the invention.

What is claimed is:

1. A substrate bias generator comprising a semiconductor substrate, a series circuit including first and second devices and a field effect transistor having first and second nodes connected between a point of reference potential and said substrate, said first and second devices being connected between said transistor and said point of reference potential and having a common point disposed at said second node, a first source of potential having a first phase coupled to said first node, and a second source of potential having a second phase out of phase with said first phase coupled to said second node, said field effect transistor having a source, a drain and a gate electrode, said transistor being connected at its source and drain between said substrate and said first node and said gate electode being connected to said second node.

2. A substrate bias generator comprising a semiconductor substrate having a given magnitude of potential, a series circuit including first and second devices and a field effect transistor having first and second nodes connected between a point of reference potential and said substrate, said first and second devices being connected between said transistor and said point of reference potential and having a common point disposed at said second node, a first source of potential having a first phase coupled to said first node, and a second source of potential having a second phase out of phase with said first phase coupled to said second node, the magnitude of the potential of said first source being greater than that of said given magnitude of potential during a given period of time, said field effect transistor having a source, a drain and a gate electrode, said transistor being connected at its source and drain between said substrate and said first node and said gate electrode being connected to said second node, the magnitude of the potential of said second source having a value sufficient to turn on said transistor during said given period of time.

3. A substrate bias generator comprising a semiconductor substrate, a series circuit including first and second devices and a field effect transistor having first and second nodes connected between a point of reference potential and said substrate, said first and second devices being connected between said transistor and said point of reference potential and having a common point disposed at said second node, first voltage means having a first phase for producing a first negative potential at said first node, and second voltage means having a second phase out of phase with said first phase for producing a second negative potential at said second node, said field effect transistor having source, drain and gate electrodes, said source electrode being connected to said second node, said control electrode being connected to said first node and said drain electrode being connected to said substate.

4. A substrate bias generator comprising a semiconductor substrate, first, second and third points of reference potential, said second point being more negative than said first point and said third point being more negative than said second point at a given period of time, first and second diodes, said first diode being disposed between said first and second points and said second diode being disposed between said second and third points, and a first field effect transistor having a control electrode, said transistor being connected between said third point and said substrate and said control electrode being coupled to said second point.

5. A substrate bias generator comprising a semiconductor substrate, a series circuit having first and second nodes connected between a point of reference potential and said substrate and first and second diodes, said first diode being disposed between said first node and said point of reference potential and said second diode being disposed between said first and second nodes, a first field effect transistor having a source, a drain and a gate electrode, said source being connected to said second node, said drain being connected to said substrate and said gate electrode being connected to said first node, and means for applying out of phase voltages to said first and second nodes.

6. A substrate bias generator as set forth in claim 4 wherein said first diode includes a second field effect transistor and said second diode includes a third field effect transistor.

7. A substrate bias generator as set forth in claim 6 wherein said first, second and third field effect transistors are N channel transistors.

8. A substrate bias generator as set forth in claim 7 wherein said second transistor includes a source, a drain and a gate electrode, the drain and gate electrode of said second transistor being connected to said second point and the source of said second transistor being connected to said first point, and wherein said third transistor includes a source, a drain and a gate electrode, the drain and gate electrode of said third transistor being connected to said third point and the source of said third transistor being connected to said second point.

9. A substrate bias generator as set forth in claim 6 wherein said second and third field effect transistors are P channel transistors.

10. A substrate bias generator as set forth in claim 9 wherein said second transistor includes a source, a drain and a gate electrode, the drain and gate electrode of said second transistor being connected to said first point and the source of said second transistor being connected to said second point, and wherein said third transistor includes a source, a drain and a gate electrode, the drain and gate electrode of said third transistor being connected to said second point and the source of said third transistor being connected to said third point.

11. A substrate bias generator comprising a semiconductor substrate having a given potential, a series circuit including first and second devices and a field effect transistor having first and second nodes connected between said substrate and a point of reference potential, said first and second devices being connected between said transistor and said point of reference potential and having a common point disposed at said second node, a first source of potential having a first phase, and a second source of potential having a second phase out of phase with said first phase, a first capacitor connected between said first source and said first node and a second capacitor connected between said second source and said second node, said first field effect transistor having source, drain and gate electrodes, said transistor being connected at its source and drain electrodes between said substrate and said first node and said gate electrode being connected to said second node.

12. A substrate bias generator as set forth in claim 11 wherein said first and second nodes are positive during a given period of time and said transistor is a P channel transistor.

13. A substrate bias generator as set forth in claim 12 wherein said first device includes a diode connected between said first and second nodes.

14. A substrate bias generator as set forth in claim 13 wherein said diode includes an N channel field effect transistor.

15. A substrate bias generator as set forth in claim 11 wherein the magnitude of said second node is greater than said given potential during selected periods of time.

16. A substrate bias generator as set forth in claim 21 wherein said semiconductor substrate has an N type conductivity and further including a well disposed within said substrate having a P type conductivity, said first and second diodes being disposed within said well.

17. A substrate bias generator as set forth in claim 13 wherein said diode includes a P channel field effect transistor.

18. A substrate bias generator as set forth in claim 23 wherein each of said first and second diodes includes an N channel field effect transistor and said semiconductor substrate has a P type conductivity.

19. A substrate bias generator as set forth in claim 23 wherein each of said first and second diodes includes a P channel field effect transistor and said semiconductor substrate has a P type conductivity having a well of N type conductivity disposed therein, said first and second diodes being disposed within said well.

20. A substrate bias generator comprising a semiconductor substrate, a series circuit including first and second devices and a transistor having first and second nodes connected between a point of reference pontential and said substrate, said first and second devices being connected between said transistor and said point of reference potential and having a common point disposed at said second node, a first source of potential having a first phase coupled to said first node, and a second source of potential having a second phase out of phase with said first phase coupled to said second node, said transistor having a pair of current-carrying electrodes and a control electrode, said transistor being connected at its current-carrying electrodes between said substrate and said first node and said control electrode being connected to said second node.

21. A substrate bias generator comprising a semiconductor substrate having a given potential, a series circuit having first and second nodes connected between said substrate and a point of reference potential, said series circuit further including a diode connected between said first and second nodes and a second diode connected between said first node and said point of reference potential, said second diode including an N channel field effect transistor, a first source of potential having a first phase, a second source of potential having a second phase out of phase with said first phase, a first capacitor connected between said first source and said first node and a second capacitor connected between said second source and said second node, and a first field effect transistor having source, drain and gate electrodes, said transistor being connected at its source and drain electrodes between said substrate and said second node and said gate electrode being connected to said first node, said first field effect transistor being a P channel transistor and said first and second nodes being positive during a given period of time.

22. A substrate bias generator comprising a semiconductor substrate having a given potential, a series circuit having first and second nodes connected between said substrate and a point of reference potential, said series circuit further including a diode connected between said first and second nodes, said diode including a first P channel field effect transistor, and a second diode connected between said first node and said point of reference potential, said second diode being a second P channel field effect transistor, a first source of potential having a first phase, a second source of potential having a second phase out of phase with said first phase, a first capacitor connected between said first source and said first node and a second capacitor connected between said second source and said second node, and a third field effect transistor having source, drain and gate electrodes, said third field effect transistor being connected at its source and drain electrodes between said substrate and said node and said gate electrode being connected to said first node, said third field effect transistor being a P channel transistor and said first and second nodes being positive during a given period of time and said semiconductor substrate being of P type conductivity.

23. A substrate bias generator comprising a semiconductor substrate having a given potential, a series circuit having first and second nodes connected between said substrate and a point of reference potential, said series circuit further including first and second diodes, said first diode being disposed between said second node and said point of reference potential and said second diode being disposed between said first and second nodes, a first source of potential having a first phase, a second source of potential having a second phase out of phase with said first phase, a first capactior connected between said first source and said first node and a second capacitor connected between said second source and said second node, and a field effect transistor having source, drain and gate electrodes, said transistor being connected at its source and drain electrodes between said substrate and said first node and said gate electrode being connected to said second node, said field effect transistor being an N channel field effect transistor.

* * * * *